United States Patent [19]

Donaher et al.

[11] 3,951,495

[45] Apr. 20, 1976

[54] LEADLESS PACKAGE RECEPTACLE

[75] Inventors: Charles Joseph Donaher, Los Altos Hills; James C. K. Lee, Santa Clara, both of Calif.

[73] Assignee: Advanced Memory Systems, Inc., Sunnyvale, Calif.

[22] Filed: Sept. 23, 1974

[21] Appl. No.: 508,464

[52] U.S. Cl. ............................................ 339/17 CF
[51] Int. Cl.² ............................................ H05K 5/02
[58] Field of Search ............ 339/17 R, 17 C, 17 CF, 339/17 L, 191 R, 191 M; 174/52 FP

[56] References Cited
UNITED STATES PATENTS

| | | | |
|---|---|---|---|
| 3,391,383 | 7/1968 | Antes | 339/17 CF X |
| 3,409,857 | 11/1968 | O'Neill et al. | 339/17 CF |
| 3,416,122 | 12/1968 | Kinkaid | 339/17 CF |
| 3,700,788 | 10/1972 | Spurck | 339/17 CF X |
| 3,846,737 | 11/1974 | Spaulding | 339/17 CF X |

*Primary Examiner*—Joseph H. McGlynn
*Assistant Examiner*—Craig R. Feinberg

[57] ABSTRACT

A leadless package receptacle for packaging and mounting electronic devices. The receptacle retains a plurality of spring contacts for soldering to a printed circuit board in a conventional manner and disposed within the receptacle to yieldably engage the lower surface of the package. The chip carrier has a plurality of conductive areas on the lower surface thereof for engaging the spring contacts and further has edge regions cooperatively disposed with respect to locking members on the receptacle for retaining the package in the receptacle. A mounting and removal tool is also disclosed.

16 Claims, 9 Drawing Figures

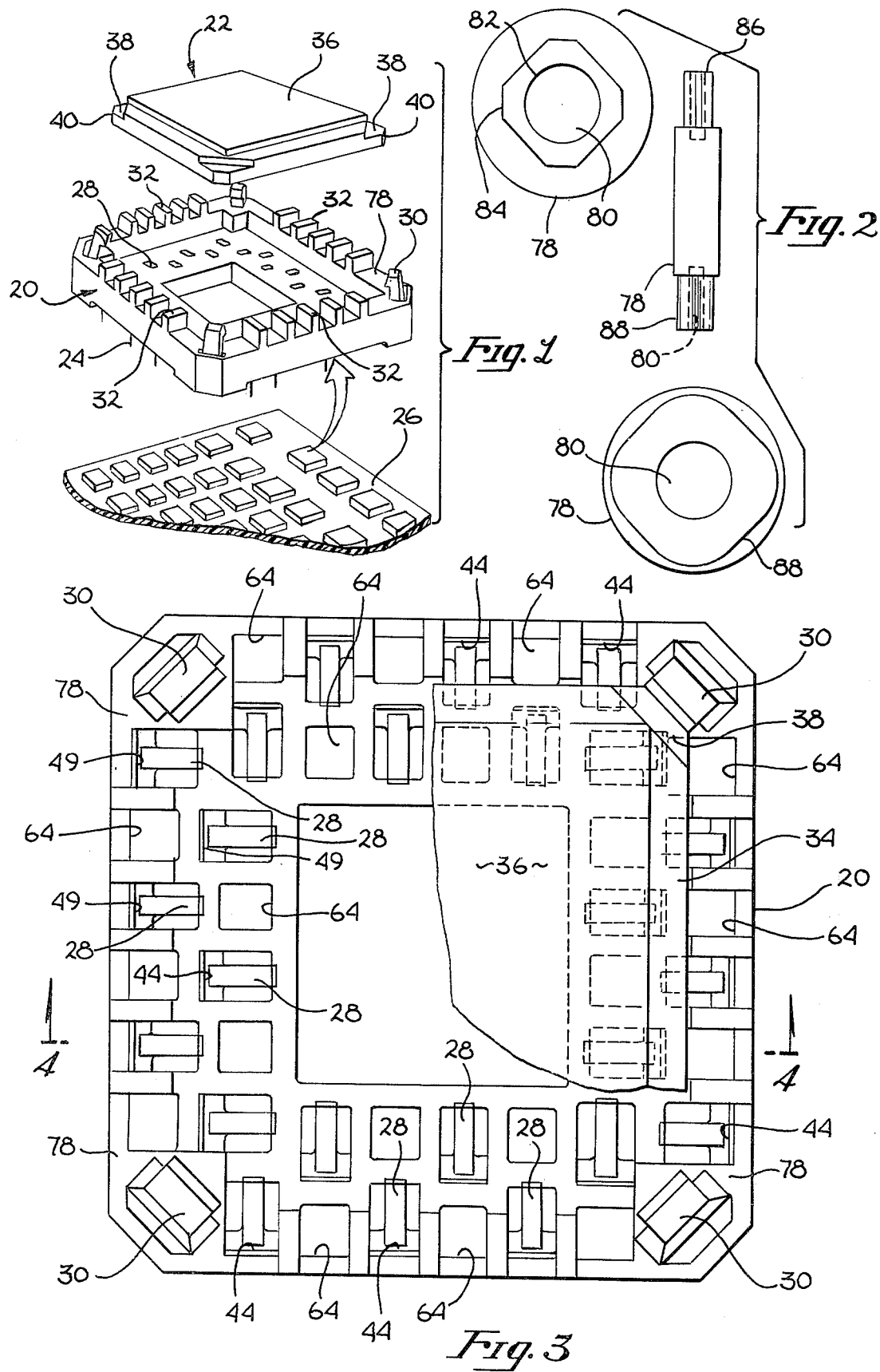

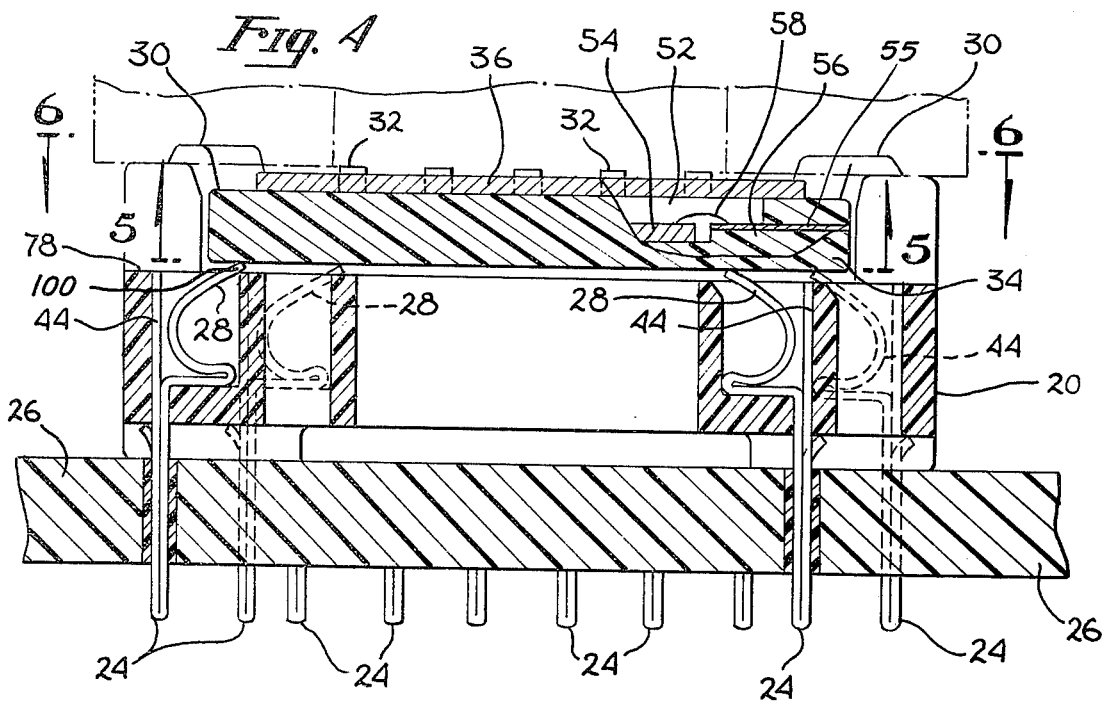
Fig. 4
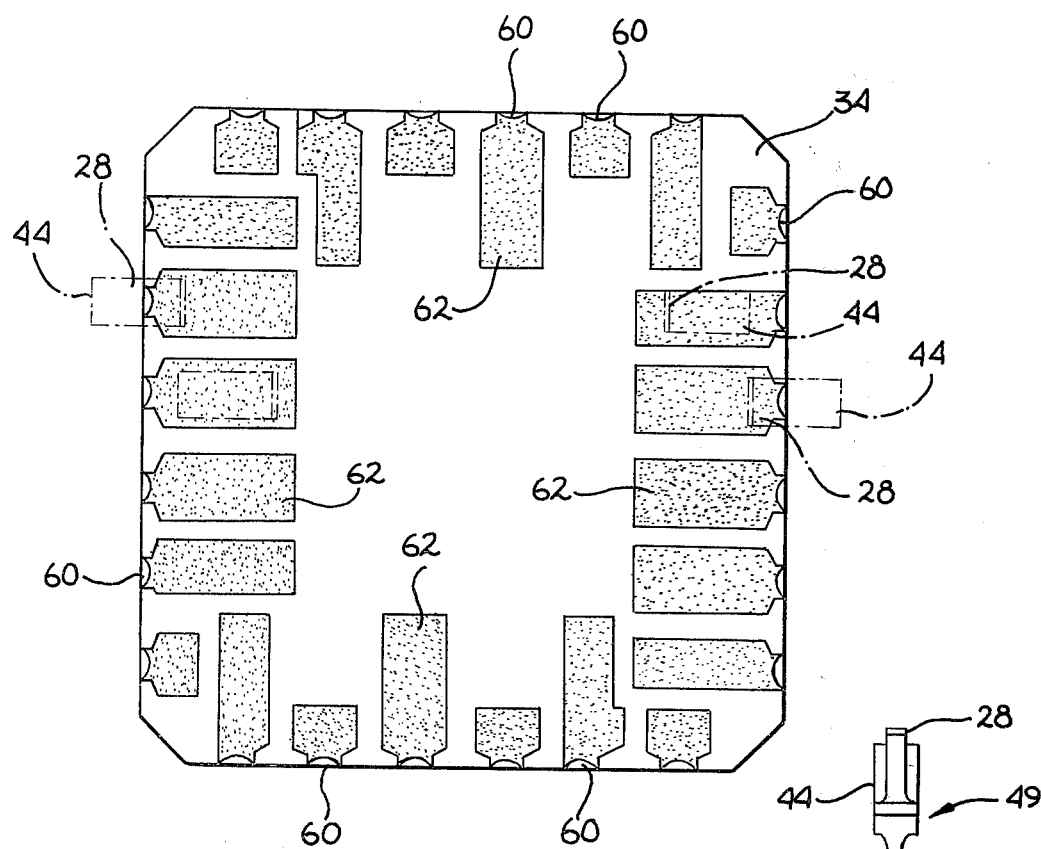
Fig. 5
Fig. 9

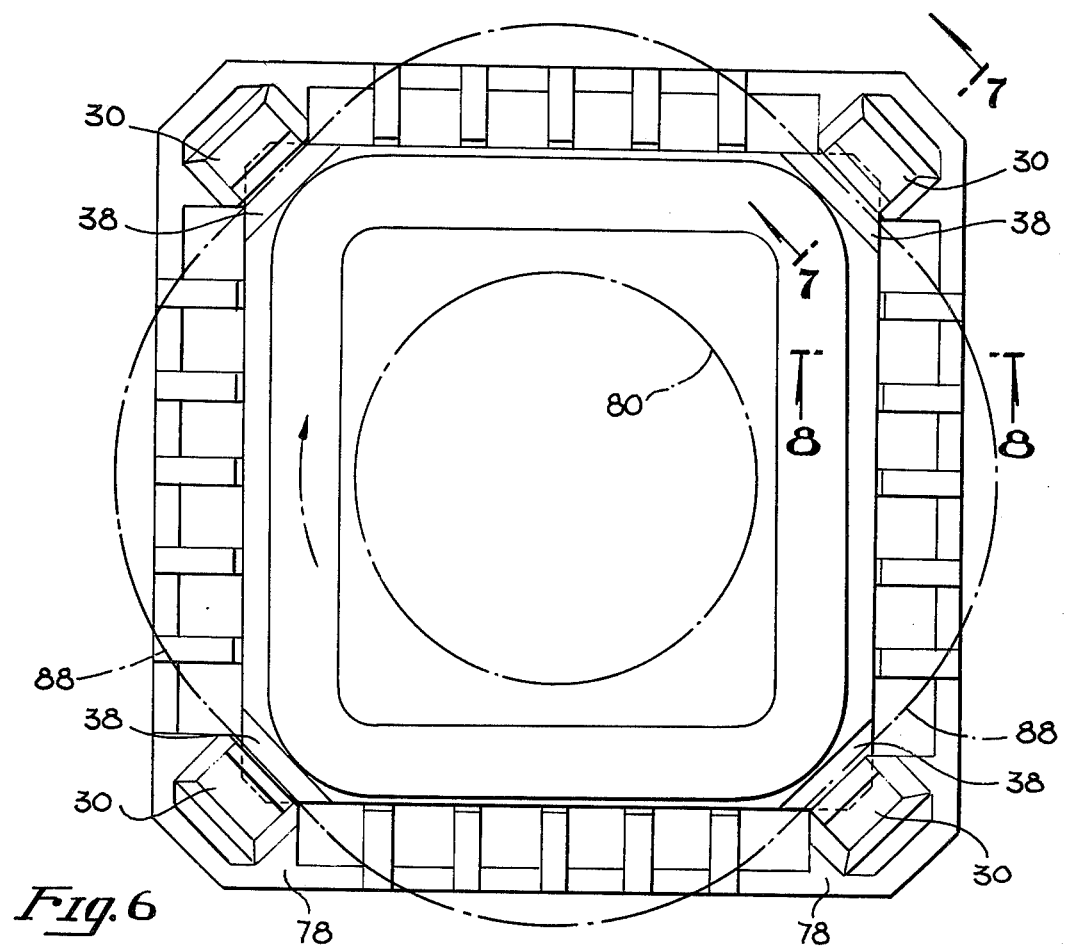
Fig. 6
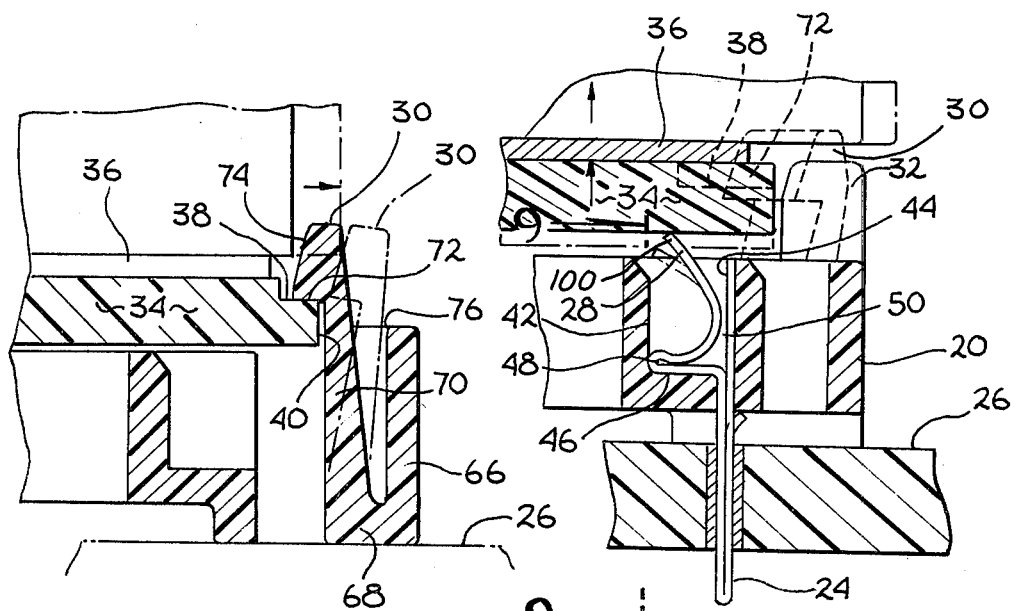
Fig. 7
Fig. 8

LEADLESS PACKAGE RECEPTACLE

BACKGROUND OF THE INVENTION

1. Field of the Invention.

The present invention relates to the field of electrical device packaging, and more particularly, to the packaging and mounting of electronic devices such as integrated circuits.

2. Prior Art.

There are many forms of packaging for electronic devices which are well known in the prior art. The fundamental requirements for such packages include mechanical and environmental protection for the electronic device and ease of incorporating into a circuit, such as a printed circuit. Other requirements may include shielding of the device from stray electric and magnetic fields and cooling of devices of high power dissipation.

In recent years, integrated circuit complexity has greatly increased, and wherever possible package sizes have tended to decrease. With certain integrated circuits, particularly integrated circuits using field effect devices, the power dissipation is extremely low, so that package sizes and packaging densities are limited in substantial part by one's ability to produce and utilize such packages on a practical basis, and of course to provide cooling when such packages are used in very high density systems. Thus, from a user's standpoint, the circuit should be removable and replaceable from a printed circuit board without requiring soldering operations and should occupy a minimum circuit board area consistent with present capabilities in terms of printed circuit board conductor size and lead requirements. Similarly, the height of the package should be held to a minimum to allow the close packing of adjacent circuit boards while still providing the air flow space therebetween.

One prior package which has been used to package integrated circuits utilizes a chip carrier, typically ceramic, having a pocket therein for receiving the integrated circuit and having a plurality of conductive regions extending into the cavity for connection to the chip. The conductive regions extend outward to the edges of the chip carrier, each connecting to one of a plurality of conductive regions extending down the side of the chip carrier exposed so as to be electrically contactable from the side of the chip carrier. A cover seals the cavity on the chip carrier to provide the ultimate mechanical and environmental protection for the electronic device (e.g. chip).

For mounting an assembled chip carrier to a printed circuit, a molded plastic connector having a plurality of individual leads is first soldered to the circuit board. The individual leads extend upward into the sides of a cavity in the top face of the connector so as to form spring contacts for contacting the conductive regions at each side of the chip carrier. Thus the chip carrier can be placed into and taken out of the mating connector to allow individual circuit testing or replacement, with the chip carrier being held into the connector by a separate locking member extending over the chip carrier and being retained at each end of the connector.

This type of package has a number of advantages over other packages such as the dual in-line packages, since it allows the removal of the circuit without soldering operations, is reasonably small and has reasonably good contact reliability because of the wiping action of the contacts when a chip carrier is inserted. However, the overall height of the connector is greater than may be necessary, as the chip carrier is inserted blow the top surface thereof, and a separate locking element extends thereabove, serving no purpose other than to retain the chip carrier in position. Also, the spring contacts on the connector are limited in the contact pressure they may exert, as the chip carrier must be inserted and removed against the frictional force created by the contacts. This presents a limitation, particularly for removal purposes, as some means must be provided to release the contact pressure or force the chip carrier out of the connector in opposition to the frictional forces. Further, there is a long wiping action between the spring contacts and the chip carrier otherwise unnecessary for proper contact.

BRIEF SUMMARY OF THE INVENTION

A leadless package receptacle for packaging and mounting electronic devices. The receptacle retains a plurality of spring contacts for soldering to a printed circuit board in a conventional manner and disposed within the receptacle to yieldably engage the lower surface of the package. The chip carrier has a plurality of conductive areas on the lower surface thereof for engaging the spring contacts and further has edge regions cooperatively disposed with respect to locking members on the receptacle for retaining the package in the receptacle. A mounting and removal tool is also disclosed. The receptacle of the preferred embodiment is a molded plastic receptacle having integral locking members at the four corners thereof and a plurality of pockets for receiving and retaining the spring contacts.

BRIEF DESCRIPTION OF THE DRAWINGS

FIG. 1 is an exploded view illustrating the major components of the present invention.

FIG. 2 is an illustration of the chip carrier assembly insertion and removal tool.

FIG. 3 is a top view of the present invention with a portion of the chip carrier assembly cut away.

FIG. 4 is a cross sectional view taken along line 4—4 of FIG. 3.

FIG. 5 is a bottom view of the chip carrier.

FIG. 6 is a top view of the chip carrier assembly and receptacle with the removal tool shown thereover in phantom.

FIG. 7 is a cross section taken along line 7—7 of FIG. 6.

FIG. 8 is a cross section taken along line 8—8 of FIG. 6.

FIG. 9 is a view of the spring contact taken along line 9—9 of FIG. 8.

DETAILED DESCRIPTION OF THE INVENTION

The present invention package, as may be seen in the perspective view of FIG. 1, is comprised of receptacle 20 and chip carrier assembly 22. The receptacle 20 has a plurality of downwardly extending leads 24 for insertion in the mating holes in a printed circuit board, such as the circuit board 26, for soldering thereto in a conventional manner, with the upper portion of leads 24 comprising a plurality of spring contacts 28 for contacting conductive regions on the chip carrier. The receptacle 20 in this embodiment is a generally square profiled, molded plastic member having its upper rim characterized by four elastic members 30 and a plurality of tooth-like projections 32.

The chip carrier assembly 22 is comprised of a chip carrier 34, typically a ceramic carrier, with a top 36, typically metal. The chip carrier of this embodiment is further characterized by relieved areas 38 adjacent each corner thereof, with the corner itself being flattened somewhat in region 40.

The members 49 comprising the terminals 24 and spring contacts 28 may be seen in FIGS. 8 and 9. These members, stamped from a strip of sheet metal and bent to the form shown in FIG. 8, are inserted into the pockets 42 in the receptacle 20 with the terminal 24 extending through a cooperatively disposed opening at the base of receptacle 20 for mounting to a printed circuit board 26 in a conventional manner. Integral with terminal 24 is a first plate-like member 44 lying against one wall of the cavity 42. Also integral with terminal 24 is a first horizontal section 46 with an approximately 180 degree bend at the end thereof at 48. Thereafter spring contact 28 curves upward in the manner shown in FIG. 8. By controlling the space or width between bend 48 and plate 44, these springs may be inserted into the pockets 42 in receptacle 20 and retained therein by their own spring action wedging bend 48 against the side of the cavity. The upward extending spring contact 28 is generally not restrained by cavity 42 so as to be yieldably encouraged downward by the lower surface of the chip carrier body upon insertion of the chip carrier assembly into the receptacle. In this regard, in the preferred embodiment the free form of the spring contact is such that there is a clearance between the contact and member 44 at region 50 so that the extent of forcible sliding of the spring contact 28 on the conductive undersurface of the chip carrier may be controlled and held to a minimum consistent with the requirement of sufficient mechanical abrasion to break any slight surface oxide which might develop on either of the mating parts. This is a substantial advantage over the prior art, as the prior art devices made contact with the chip carrier not from the bottom thereof but from the side thereof, resulting in a snow plowing action across the entire length of the side by the spring contact making contact therewith.

Now referring to FIGS. 4 and 5, the detail of the chip carrier assembly may be seen. The chip carrier 34 has a pocket 52 in the top surface thereof for receiving the electronic component, typically an integrated circuit chip 54. A plurality of metal contacts or metallized regions are provided on the step 56, typically approximately the same altitude as the contact pads on the chip 54 so that conventional wire bonding means may be used to provide lead wires 58 between the chip and the metallized regions on surface 56. These metallized regions extend through the wall of the chip carrier 34 to make contact with metallized side regions 60 and the metallized contact regions 62 on the base or bottom surface of the carrier 34. Also typically at least one of the contact regions 62 is in electrical contact with the metallized region to which the metal cover 36 is fastened so as to provide electrostatic shielding for the electronic device by the cover. These aspects, except for the metallized regions 62 on the bottom of the carrier are generally well known in the art and will not be further described herein. It will be seen, however, that as a result of this structure, there is a pattern of contact pads on the bottom surface of the chip carrier connected in a predetermined manner to the device packaged within the chip carrier assembly, and typically to the cover and base of the pocket in which the chip 54 is mounted so as to provide shielding for the device and a substrate contact.

Now referring to FIG. 3, a top view of the assembly of the receptacle and chip carrier assembly, with the chip carrier assembly partially cut away, may be seen. It will be seen that the receptacle contains a pattern of pockets within which the leads and contact members, generally indicated by the numeral 49, may be inserted to form an upward projecting pattern of spring contacts 28 cooperatively disposed with respect to the electrical contact regions 62 on the bottom surface of the chip carrier.

As clearly shown in FIG. 3, there are a plurality of pockets arranged in configuration in a predetermined pattern. In the presently preferred embodiment, as indicated in this figure, the pockets are arranged such that they alternate between forward and backward positions, i.e. along each side of the receptacle 20, each pocket is either disposed toward the center of the receptacle (forward) or toward the outer periphery of the receptacle (backward) in an alternating configuration. There is also provided a plurality of openings 64 adjacent the contact members 49 which serve to reduce the cross section of plastic and maintain a relatively uniform cross section to minimize the amount of material required and the warpage incurred during molding, and to maximize the rate of cooling of the molded part so that low injection molding cycle times may be used.

As previously mentioned, the fingers 30 snap over the corner regions 40 to retain the chip carrier assembly by engagement of surfaces 38, as may be seen in FIG. 1. Details of the finger 30 may be seen in FIG. 7. Each of the corner fingers, disposed generally at 45° with respect to each side of the receptacle, are integrally molded as part of the receptacle body. The fingers 30 join the outer wall 66 at the lower region 68 thereof and comprise an upward extending portion 70 having at the top thereof an inward directed horizontally inward extending surface 72 and a tapered outward and upward extending surface 74. It will be noted that the upward extending member 70 is tapered somewhat having a greater cross section at the lower portions thereof. Thus, while the bending moment is greatest near the bottom thereof when the finger is forced to the position shown in phantom in FIG. 7, the bending is relatively uniformly distributed, maximizing the amount of elastic deflection achievable without breakage or failure to elastically return. In the preferred embodiment materials and proportions are selected so that the finger, when depressed outward as shown in phantom, will contact the edge 76 of the receptacle before any deterioration is caused by the deflection. Accordingly, only extreme misuse will cause damage or breakage of the finger as a result of the incorporation of this built in stop.

As may be seen in FIG. 7, the finger snaps over the corner 40 of the chip carrier assembly as a result of the tapered surface 74 so that surface 72 will engage the chip carrier on the corner surfaces 78 and retain the chip carrier in the desired position. In the preferred embodiment, surfaces 38 are provided so that the height of the finger is only slightly higher than the top surface of the cover 36 of the chip carrier to maintain a low profile in the assembly for maximum possible packaging density. Of course also the relative proportions of the receptacle pockets and the spring contact members 49 are chosen so that as the chip carrier assembly is pushed into the position shown in FIG. 7, all spring contacts make electrical contact with the respective metallized regions 62 on the bases of the chip carrier assembly and a controlled deflection of the contact 28 is achieved to insure the desired contact pressure and positive electrical contact between the terminals 24 and the respective regions in the packaged chip this is most clearly seen with reference to FIGS. 4 and 8. In these Figures, the end member 100 of contact 28 is shown as having an acute angle with respect to the chip carrier 34. As hereinabove discussed, the end member 100 forceably slides across the bottom of the chip carrier 34, and more specifically, the metallized regions 62, and thereby insures positive electrical contact between the terminals 34 and the respective regions in the packaged chip. As shown in FIG. 8, the end member 100 is deflected slightly upon insertion of the chip carrier 34. Note, however, that after the sliding action of the member 100 against the metalized surface 62 has taken place, a point contact still remains between member 100 and contact metallized regions 62.

Now referring to FIG. 4, one of the features of the present invention not heretofore referred to may be seen. The tooth-like regions 32 were previously mentioned with respect to FIG. 1. These regions extend upward from surface 78, which is located approximately level with the bottom surface of the chip carrier 34 when mounted, as shown in FIG. 4. Further, as may be seen in FIG. 3, the tooth-like members are located between the contact members 49. Accordingly, the metallized regions 60 at the side of the chip carrier 34 are individually available for test purposes between the tooth-like members 32, with the result that it is virtually impossible for a probe to slip off one metallized region to contact the next metallized region, or to inadvertently short such regions together. A slight depression at each metallized region is further insurance of positive location of any probe.

Now referring to FIG. 2, an insertion and removal tool for inserting and removing the assembled chip carrier from the receptacle of the present invention may be seen. The tool is characterized by a central section 78 having on one end thereof a projection for aiding in the inserting of an assembled chip carrier into the receptacle, and on the other end a projection to use in removing assembled chip carriers from the receptacle. Thus, on the insertion end there is provided a permanent magnet 80 mounted in a projection 82, which in this embodiment is approximately square with flattened corner regions 84. The cover 36 of an assembled chip carrier is typically a magnetic material so that the permanent magnet 80 will hold the assembled chip carrier directly against the end face 86 of the insertion tool. Thus, by merely pressing the tool with chip carrier in position against the receptacle, the chip carrier may be caused to snap over the finger members so as to be retained thereby, since the insertion tool and particularly the flattened corners are such as to allow the fingers to snap into position against surfaces 38 on the chip carrier.

The projection forming the removal tool also has a permanent magnet 80 on the end thereof. The body 88 surrounding the magnet and forming the removal tool has a cross section which may be roughly identified as square with generously radiused corners. In particular, the side to side dimension is less than the rounded corner to rounded corner dimension and is specifically chosen to be just less than the separation between opposite locking fingers. This is illustrated in FIG. 6, which is a top view of the assembly with the end of the removal tool shown in phantom. By rotating the removal tool, the generously rounded corners act as cam surfaces forcing the locking fingers to the outward position, as illustrated in phantom in FIG. 7, and releasing the chip carrier thereunder. When so positioned, the end of the removal tool is positioned against and resting on the top of tooth-like members 32, which are disposed at an altitude slightly below the top of the locking fingers 30 and at a position somewhat above the top of the cover 36 on the chip carrier assembly. Accordingly, when rotated the rounded corners will engage and separate the fingers to release the chip carrier assembly, which in turn will snap outward by the combined forces of the spring members 49 and the permanent magnet so that by straight withdrawal of the removal tool, the chip carrier assembly is entirely removed from the receptacle. Of course while insertion and removal may be accomplished without the use of such special tool, the use of a tool of this type makes insertion and removal of devices particularly easy.

There has been described herein a chip carrier and receptacle together with an insertion and removal tool which provide high density packaging, high reliability in the electrical contact between the chip carrier and receptacle, and which minimizes deterioration of the conductive regions on the chip carrier by minimizing the extent of sliding between the spring contact and the metallized region. While the preferred embodiment has been described in detail herein, it will be understood by those skilled in the art that various changes in form and detail may be made therein without departing from the spirit and scope of the invention.

I claim:
1. A chip carrier and receptacle comprised of:
   a nonconductive receptacle body having means for receiving a chip carrier assembly;
   a plurality of spring contact members in said body, each of said contact members having a portion thereof forming a lead extending downward from said body, each of said contact members further having an integral cantilevered extension projecting into a central region of a said body for contacting and yieldably engaging a conductive surface on the bottom of said chip carrier assembly, said cantilevered extension having an end member, said end member making an acute angle with respect to said conductive surface on the said chip carrier assembly such that when said chip carrier assembly is disposed therein, said end member forcibly slides across said conductive surface; and
   a chip carrier assembly having a plurality of conductive areas on its bottom surface; and
   means for releasably retaining said chip carrier assembly in said receptacle, whereby each said spring contact member is in forcible contact with a respective conductive surface.
2. The chip carrier receptacle of Claim 1 wherein the periphery of said receptacle is defined at least in part by upward projecting tooth-like members, said tooth-like members being disposed at each side of said spring contact members, and wherein said conductive areas on said bottom of said chip carrier assembly extend along at least a portion of the sides of said chip carrier assembly, whereby said conductive areas are exposed for probing between said tooth-like members on said receptacle.

3. The chip carrier receptacle of Claim 1 wherein said plurality of spring contact members are arranged and configured in a predetermined pattern wherein said spring contact members alternating between being disposed toward the center of said receptacle and toward the outer periphery of said receptacle.

4. The chip carrier of Claim 1 wherein said receptacle has a generally square profile and wherein said means for releasably retaining said chip carrier assembly comprises spring fingers disposed on each corner on said receptacle for snapping over the edge of said chip carrier assembly.

5. The chip carrier receptacle of Claim 4 wherein said receptacle body is a molded plastic body.

6. The chip carrier of Claim 4 wherein said spring fingers are integral with said body.

7. The chip carrier of Claim 6 wherein said spring fingers extend to an elevation above the rest of said receptacle.

8. A chip carrier receptacle comprising:
a nonconductive receptacle body having a means for receiving a chip carrier assembly;
a plurality of spring contact members in said body, each of said contact members having a portion thereof forming a lead extending downward from said body, each of said contact members further having a spring contact cooperatively disposed with respect to said receptacle so as to engage a conductive area on the bottom surface of said chip carrier assembly upon insertion thereof, said plurality of spring contact members arranged and configured in a predetermined pattern and wherein each of said spring contacts are cantilevered spring members having a cantilevered extension for engaging a conductive surface on the bottom of said chip carrier assembly, said cantilevered extension having an end member, said end member making an acute angle with respect to said conductive surface on said chip carrier assembly such that when said chip carrier assembly is disposed therein, said end member forcibly slides across said conducting surface and makes a point contact with said conducting surface; and
means on said receptacle body for releasably retaining said chip carrier assembly in said receptacle.

9. The chip carrier receptacle of Claim 8 wherein said receptacle body is a molded plastic body.

10. The chip carrier receptacle of Claim 8 wherein the periphery of said receptacle is defined at least in part by upward projecting tooth-like members, said tooth-like members being disposed at each side of said spring contact members such that a probing tool may be disposed between adjacent tooth-like members and contact the sides of said chip carrier assembly.

11. The chip carrier of Claim 8 wherein said means for releasably retaining a chip carrier assembly comprises spring fingers on said receptacle for snapping over the edge of a chip carrier assembly.

12. The chip carrier of Claim 11 wherein said spring fingers are integral with said body.

13. The chip carrier of Claim 12 wherein said spring fingers extend to an elevation above the rest of said receptacle.

14. A chip carrier receptacle comprising:
a non-conductive receptacle body having a central region for receiving a chip carrier assembly, and having a plurality of pockets for receiving spring contact members;
a plurality of spring contact members, each of said contact members being pressed into one of said pockets and extending through said body so as to provide package leads, each of said spring contact members having an integral cantilevered extension projecting into said central region of said body for contacting and yieldably engaging a conductive surface on the bottom of said chip carrier assembly, said cantilevered extension having an end member, said end member making an acute angle with respect to said conductive surface on said chip carrier assembly such that when said chip carrier assembly is disposed therein, said end member forcibly slides across said conductive surface and makes a point contact with said conductive surface; and
means on said receptacle body for snapping over the edge of and retaining said chip carrier assembly therein.

15. The chip carrier receptacle of Claim 14 wherein the upper edge of said receptacle is comprised of a plurality of tooth-like projections, said projections and said spring contact members arranged and configured such that a probing tool may be disposed between adjacent tooth-like projections and contact the sides of said chip carrier assembly.

16. The chip carrier receptacle of Claim 15 wherein said means for snapping over the edge of a chip carrier assembly are elastic locking members molded as an integral part of said body.

* * * * *